United States Patent [19]
Wei et al.

[11] Patent Number: 5,719,733
[45] Date of Patent: Feb. 17, 1998

[54] ESD PROTECTION FOR DEEP SUBMICRON CMOS DEVICES WITH MINIMUM TRADEOFF FOR LATCHUP BEHAVIOR

[75] Inventors: Hua-Fang Wei, Sunnyvale; Ashok Kapoor, Palo Alto, both of Calif.

[73] Assignee: LSI Logic Corporation, Milpitas, Calif.

[21] Appl. No.: 556,599

[22] Filed: Nov. 13, 1995

[51] Int. Cl.$^6$ .............................. H02H 3/22; H01L 23/62
[52] U.S. Cl. .................. 361/56; 361/111; 257/173; 257/356
[58] Field of Search ................ 361/56, 111, 91; 257/111, 173, 355, 356, 357–360

[56] References Cited

U.S. PATENT DOCUMENTS

| | | | |
|---|---|---|---|
| 5,140,401 | 8/1992 | Ker et al. | 257/357 |
| 5,343,053 | 8/1994 | Avery | 257/173 |
| 5,400,202 | 3/1995 | Metz et al. | 361/56 |
| 5,430,595 | 7/1995 | Wagner et al. | 361/56 |

Primary Examiner—Jeffrey A. Gaffin
Assistant Examiner—Michael J. Sherry
Attorney, Agent, or Firm—John F. Schipper

[57] ABSTRACT

Apparatus and process for making the apparatus for electrostatic discharge (ESD) protection of an electronic device, using a silicon controlled rectifier (SCR) configuration. A spaced apart p-well and n-well are formed in a substrate, and spaced apart p+ and n+ contact regions are formed in each well, with an additional n+ or p+ drain tap contiguous to and lying between the two wells. The wells may be formed by a retrograde process or by a conventional process, with or without an epitaxial layer. A first electrode (ground) is connected to the p+ and n+ contact regions and through a polysilicon region to a gate oxide region in the first well. The polysilicon region has a small, controlled poly length. A second electrode is connected to the p+ and n+ contact regions in the second well and to an electrical circuit to be protected against ESD. The second well may be replaced by a portion of the substrate, of opposite electrical polarity to the first well. The triggering voltage for snapback of the SCR device is tunable over a voltage range as low as 5–11 Volts, and the device dynamical resistance in the on-state is about 8–9 Ohms. The SCR device has reduced tradeoff with latchup behavior of the electronic device to be protected.

40 Claims, 15 Drawing Sheets

ESD PROTECTION FOR DEEP SUBMICRON CMOS DEVICES WITH MINIMUM TRADEOFF FOR LATCHUP BEHAVIOR

FIELD OF THE INVENTION

This invention relates to provision of electrostatic discharge protection for CMOS semiconductor devices.

BACKGROUND OF THE INVENTION

Prevention of electrostatic discharge (ESD) damage to gate oxides at input buffers and to NMOS components at bidirectional buffers and output drivers is a serious concern. To provide such damage, an on-chip ESD protection device must trigger and release a built-up electrical charge at a voltage substantially below the breakdown voltages for the gate oxides and the NMOS components. Silicide processes and processes that produce lightly doped drain (LDD) regions can degrade NMOS ESD protection performance, as reported by K. L. Chen in I.E.E.E. Trans. Electron Devices, vol. 35 (1988) pp. 2140–2150. ESD modelling and factors affecting reliability are reviewed by Duvvury and Amerasekera in Proc. I.E.E.E., vol. 31 (1993) pp. 690–702.

FIG. 1 illustrates a bulk CMOS configuration involving a spaced apart sequence of p+, n+, p+ and n+ surface contacts in an n-well, embedded in a p or p− substrate. Voltage latchup by an intrinsic, parasitic vertical transistor VT1 and/or by an intrinsic, parasitic lateral transistor LT1 is a concern here. This concern grows as the CMOS channel lengths and associated channel separation widths decrease below 0.5 µm. R. R. Troutman, in *Latchup In CMOS Technology*, Kluwer Academic Publishers, Boston, 1986, reviews the consequences of development of latchup in a CMOS circuit.

Latchup arises from an internal pnpn structure formed by a parasitic npn lateral transistor and a linked parasitic vertical pnp transistor. Voltage breakdown and snapback in this structure, with uncontrollable development of a current gain factor that can exceed several hundreds, occurs at a well defined triggering or threshold voltage, $V=V_{tr}$, where the circuit switches from a current blocking state to a current latching state. FIG. 2A graphically illustrates what occurs during and after this switching in an internal pnpn structure (FIG. 2B), where the imposed voltage V suddenly falls from $V_{tr}$ to a lower switch value $V_h$ and the dynamic resistance $\Delta V/\Delta I$ falls by an order of magnitude or more. Because of the sudden increase in current, the circuit can be destroyed or seriously disabled, especially in a gate oxide region.

Latchup in a CMOS circuit can be prevented if the sum of the small signal, common base current gains for the vertical and lateral parasitic transistors are kept below 1.0. Two well known approaches for avoiding latchup are: (1) bipolar spoiling, in which the CMOS circuit fabrication process is modified to spoil transistor action by reducing minority carrier transport and/or minority carrier injection; and (2) bipolar decoupling, in which the fabrication process is altered to decouple the bipolar transistors so that turn-on of one such transistor does not produce turn-on of another such transistor.

Bipolar gain spoiling can be implemented by: (1) heavy doping with gold or another element that sharply reduces the minority carrier lifetime in the doped region; for a p-well depth of 9 µm and 2 µm, the corresponding minimum doping concentration is $10^{15}$ cm$^{-3}$ and $10^{16}$ cm$^{-3}$, respectively; (2) neutron irradiation of the affected region, followed by light annealing; for a p-well depth of 9 µm; a minimum irradiation fluence with 100 keV neutrons at about $10^{14}$ cm$^{-2}$ is required, and this minimum fluence increases as the well depth decreases, which produces increasing leakage current; (3) internal gettering in the region of concern, by creating an oxygen-denuded zone near the surface where the minority carrier lifetime remains high, and annealing to produce oxygen clusters and the associated metal gettering in the remainder of the wafer; the desired effects of gettering disappear for p-substrate to p-well spacings below about 100 µm.

Another method of bipolar gain spoiling of the vertical parasitic transistor(s) is to build a retarding electric field into the transistor base, using a retrograde well in which the doping increases as the depth within the well increases, in moving from emitter to base to collector. A retrograde well can be provided by a buried p+ layer under a p-well, using a masked boron implant before growth of-an associated n-epitaxial layer. After growth of the epi layer, boron is again implanted, but in lower concentration, to form the p-well. Gain of the associated vertical parasitic transistor can be reduced by about two orders of magnitude, using this technique. The product of the associated electrical field and the increased Gummel number for the (out-diffusing) buried layer should be greater than about 100 millivolts. Reduction of vertical transport tends to increase lateral transport of the minority carriers so that a proportionately smaller increase in lateral parasitic transistor gain often accompanies vertical gain spoiling using a buried layer.

A retrograde p-well can also be formed using a high energy boron implant that places the peak of the boron ion profile at least one µm below the surface. This implant is performed after growth of any field oxide region, and only a brief annealing period is used. This approach may reduce vertical and lateral parasitic transistor gain, but the resulting gain for either direction is often still 30–50. A high energy phosphorous implant can be used to provide a retrograde n-well here.

A retrograde p-well can also be provided by boron implant, thermal drive-in and phosphorous implant to achieve a counterdoped layer with net acceptor concentration of about $5\times10^{15}$ cm$^{-3}$. This reduces the vertical parasitic transistor gain, but the resulting gain is still above 100. As noted by Troutman, op cit, use of laterally positioned guard rings, together with a retrograde well, can often limit the effects of parasitic transistor gain and the associated carrier injection to acceptable values. ESD phenomena in a graded junction device are reviewed by Duvvury et al in Proceedings of the Annual I.E.E.E. Reliability Physics Meeting (11–13 Apr. 1989, Phoenix) pp. 71–76.

Ker et at, in U.S. Pat. No. 5,140,401, disclose a CMOS ESD protection circuit in which a first SCR ESD circuit is connected between a line to be protected and a first power supply point, and a second SCR ESD circuit is connected between the line to be protected and a second power supply point. The power supply points serve as current sinks and provide reference voltages at which the SCRs turn on. A center p-well serves as part of each of two vertical parasitic transistors, with each transistor being associated with a separate SCR.

In U.S. Pat. No. 4,182,220, Ker et al disclose a ESD protection circuit that is similar to that disclosed in the 5,140,401 patent, with four SCR devices being used for this purpose.

An SCR device for ESD protection, using n+, p+ and n+ regions separated by gate oxide and field oxide regions, is disclosed in U.S. Pat. No. 5,225,702, issued to Chatterjee.

U.S. Pat. No. 5,343,053, issued to Avery, discloses use of three n+/p+ contact regions adjacent to each other to provide an SCR device for ESD protection.

Metz et al disclose use of two n+/p+ contact regions, separated from an n+ contact region by field oxide and gate oxide regions, to form an SCR device for ESD protection in U.S. Pat. No. 5,400,202.

Use of n+, p+, n+, n+ and n+ contact regions, separated by field oxide regions, to form an SCR device for ESD protection is disclosed by Wagner et al in U.S. Pat. No. 5,430,595.

Designs, such as that illustrated in FIG. 3A, for ESD protection using an SCR (silicon controlled rectifier) have been reported in the literature and are discussed by Chatterjee and Polgreen in I.E.E.E. Electron Devices Letters, vol. 12 (1991) pp. 21–22. In the FIG. 4B NMOS design, a first n+ contact region, which serves as cathode, and an adjacent gate oxide region are positioned in a p-substrate, which is adjacent to an n-well. A second n+ region, adjacent to the gate oxide region, lies partly in the p-substrate and partly in the n-well and serves as a drain tap. A p+ contact region and an adjacent n+ region, positioned within the n-well, together serve as anode and are spaced apart from the drain tap by a field oxide region. This prior art ESD protection device has a trigger voltage as high as 50 Volts, as shown in FIG. 3B, which is too high to prevent ESD damage to some thin gate oxide regions.

What is needed is an SCR device that provides protection against ESD due to triggering of lateral and vertical bipolar transistor action in a voltage rectifier. Preferably, this SCR device should trigger, and thus provide ESD protection, at voltages below 10 Volts, should have a tunable triggering voltage, and should have relatively low-dynamical resistance $R_{dyn}=\Delta V/\Delta I$ in the on-state. Preferably, the SCR device should not require much trade-off or compromise to compensate for I/O latchup and should allow use of small distances between SCR devices and I/O drivers.

SUMMARY OF THE INVENTION

These needs are met by the invention, which uses conventional or retrograde well implant and silicide processes to fabricate ESD protection using tunable, low voltage triggering SCR (LVTSCR) devices in which triggering occurs at voltages in the range 5–20 Volts and is controllable within that range. Features of the present approach include the following: (1) retrograde well fabrication, or conventional well implant and epitaxy methods, can be used to form the different p-well and n-well regions; (2) replacement of a field oxide region by a thinner gate oxide region under a polysilicon MOSFET gate region in the invention; (3) connection of the polysilicon MOSFET gate region to the grounded electrode, rather than to the I/O electrode, in the invention; (4) use of buffered contacts, in contrast to the unbuffered contacts used in the prior art; (5) achievement of relatively low dynamic or differential resistance ($\Delta V/\Delta I \approx 8.3$ Ohms) in the on-state, which reduces the associated ESD resistance; (6) use of a thin guard band that is integrated with one of the tap regions to suppress minority carrier injection and to control development of latchup due to SCR electrode injection during latchup testing and subsequent operation; and (7) recognition and treatment of the role of development and triggering of lateral and vertical bipolar transistor action in promoting or initiating ESD in an SCR.

In providing ESD protection for a deep submicron integrated circuit device, one desires a low triggering voltage and low associated resistance for the ESD triggering device. These desired features are often inconsistent with desired core device performance characteristics, where high triggering voltage of parasitic bipolar devices is built in to suppress development of latchup in the device. The invention provides good ESD protection without sacrificing latchup suppression.

DESCRIPTION OF BEST MODES OF THE INVENTION

Figure 1:
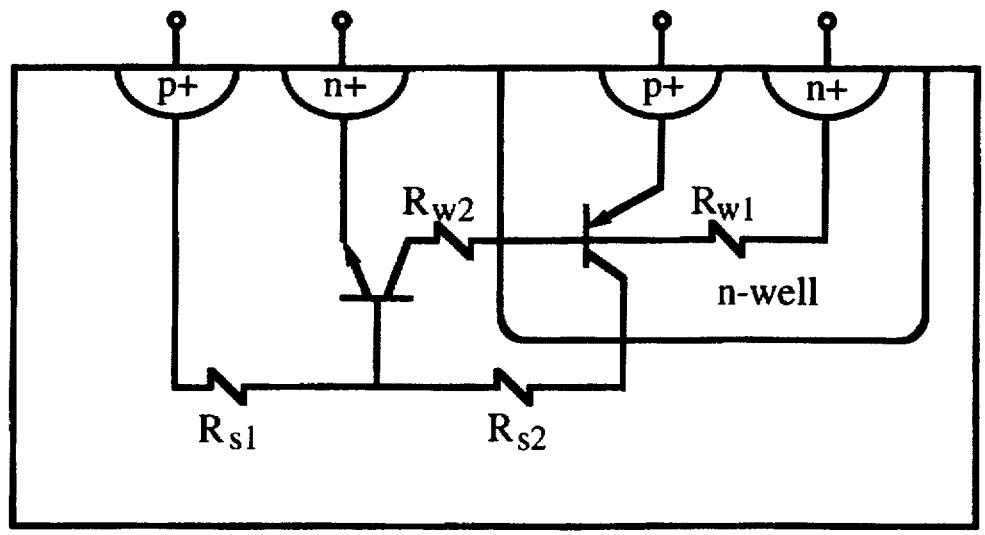
FIG. 1 schematically illustrates development of parasitic transistor action in vertical and lateral directions.
Figures 2A, 2B:
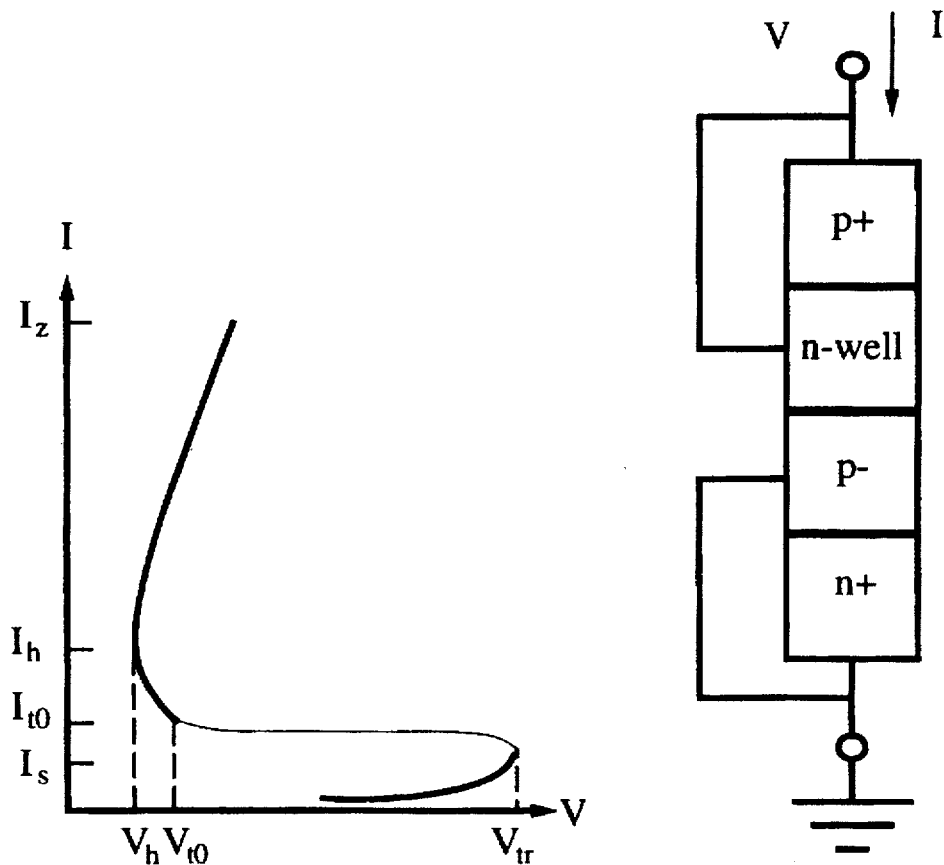
FIG. 2A graphically illustrates the current versus voltage switching that occurs in an internal pnpn transistor, illustrated in FIG. 2B.
Figure 3A:
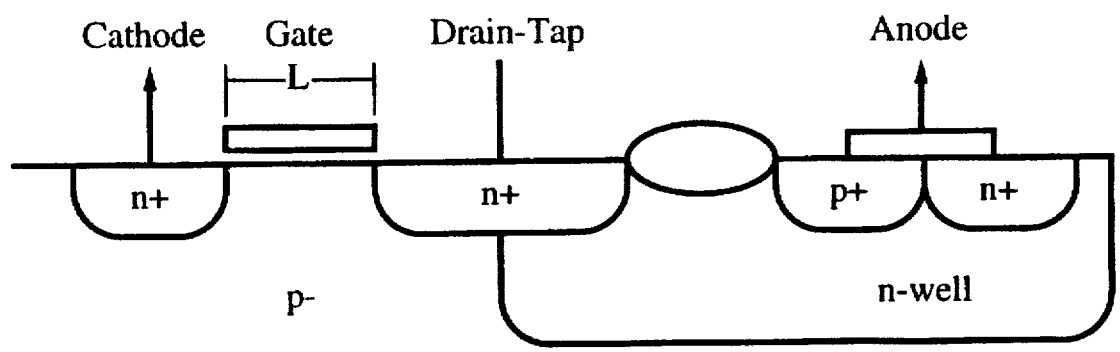
FIG. 3B graphically illustrates the current versus voltage switching that occurs in a conventional SCR design, illustrated in FIG. 3A.
Figure 3B:
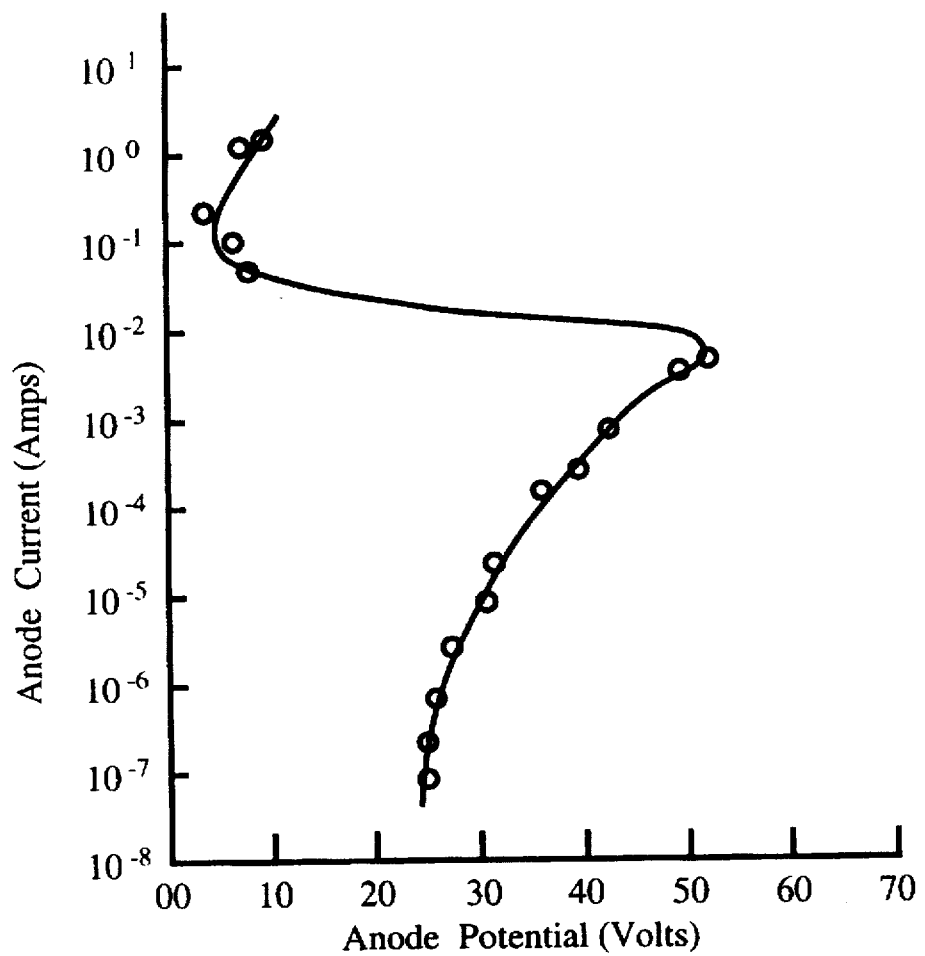
Figure 4:
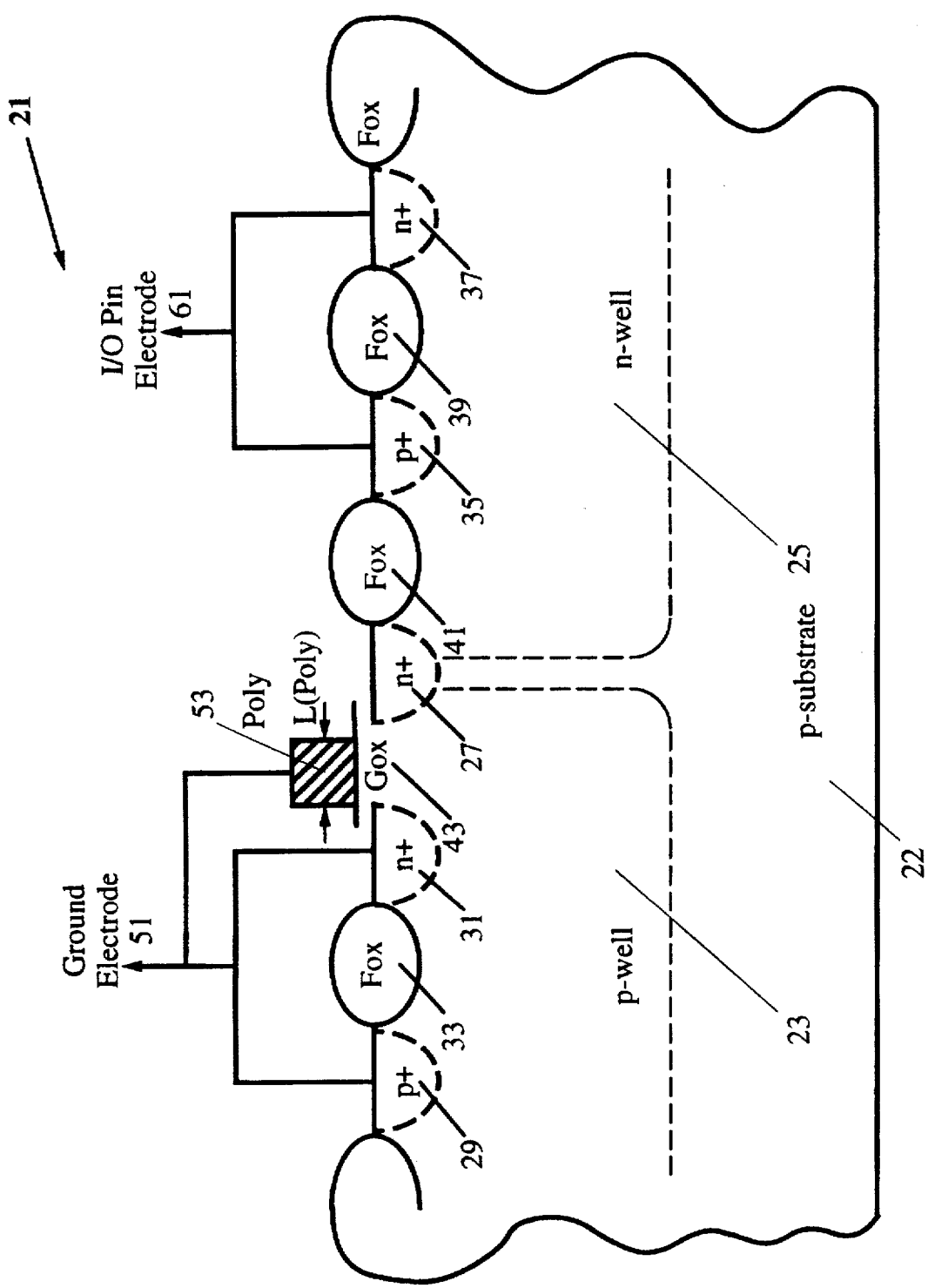
FIG. 4 schematically illustrates a representative SCR design, constructed according to the invention to handle positive electrical pulses.

FIG. 4 illustrates one embodiment 21 of the invention for ESD protection incorporating an SCR. A p-well 23 and an adjacent n-well 25 are formed in a p substrate 22, using either a retrograde well implant process or a conventional well implant process. The p-well 23 and n-well 25 are separated by a small distance, in the range 0.05–1 μm, and are connected by an n+ drain region 27, preferably having a peak carrier concentration below the surface of about $10^{19}$–$10^{20}$ cm$^{-3}$. A first p+ tap region 29 and a first n+ tap region 31 are formed at spaced apart locations in the p-well 23, have widths w measured parallel to the exposed surfaces of the wells of 200–1000 Å, and are separated by a first field oxide ($F_{ox}$) region 33 that preferably has a thickness of 200–6000 Å and a length in the range 0.1–10 μm. The first p+ tap region 29 and the first n+ tap region 31 preferably have carrier concentrations of about $10^{20}$–$10^{21}$ cm$^{-3}$ near the surface. A second p+ tap region 35 and a second n+ tap region 37 are formed at spaced apart locations in the n-well 25 and are separated by a second field oxide region 39 that preferably has a thickness of 200–6000 Å and a length in the range of 0.1–10 μm. The second p+ tap region 35 and the second n+ tap region 37 preferably have carrier concentrations of about $10^{20}$–$10^{21}$ cm$^{-3}$ near the surface. The second p+ tap region 35 is separated from the n+ drain region 27 by a third field oxide region 41. A gate oxide ($G_{ox}$) region 43, with a thickness in the range 40–200 Å (preferably≈70 Å) and a channel length in the range 0.1–1 μm (preferably≈0.4–0.7 μm), separates the first n+ tap region 31 from the n+ drain region 27.

A first electrode 51 is formed by electrically connecting the first p+ tap region 29, the first n+ tap region 31 and a polysilicon region 53 that is contiguous to the gate oxide region 43 and is grounded. A second electrode 61, having opposite electrical polarity to the first electrode 51, is formed by electrically connecting the second p+ tap region 35 and second n+ tap region 37 and is connected to an input-output (I/O) pin.

Figure 5:
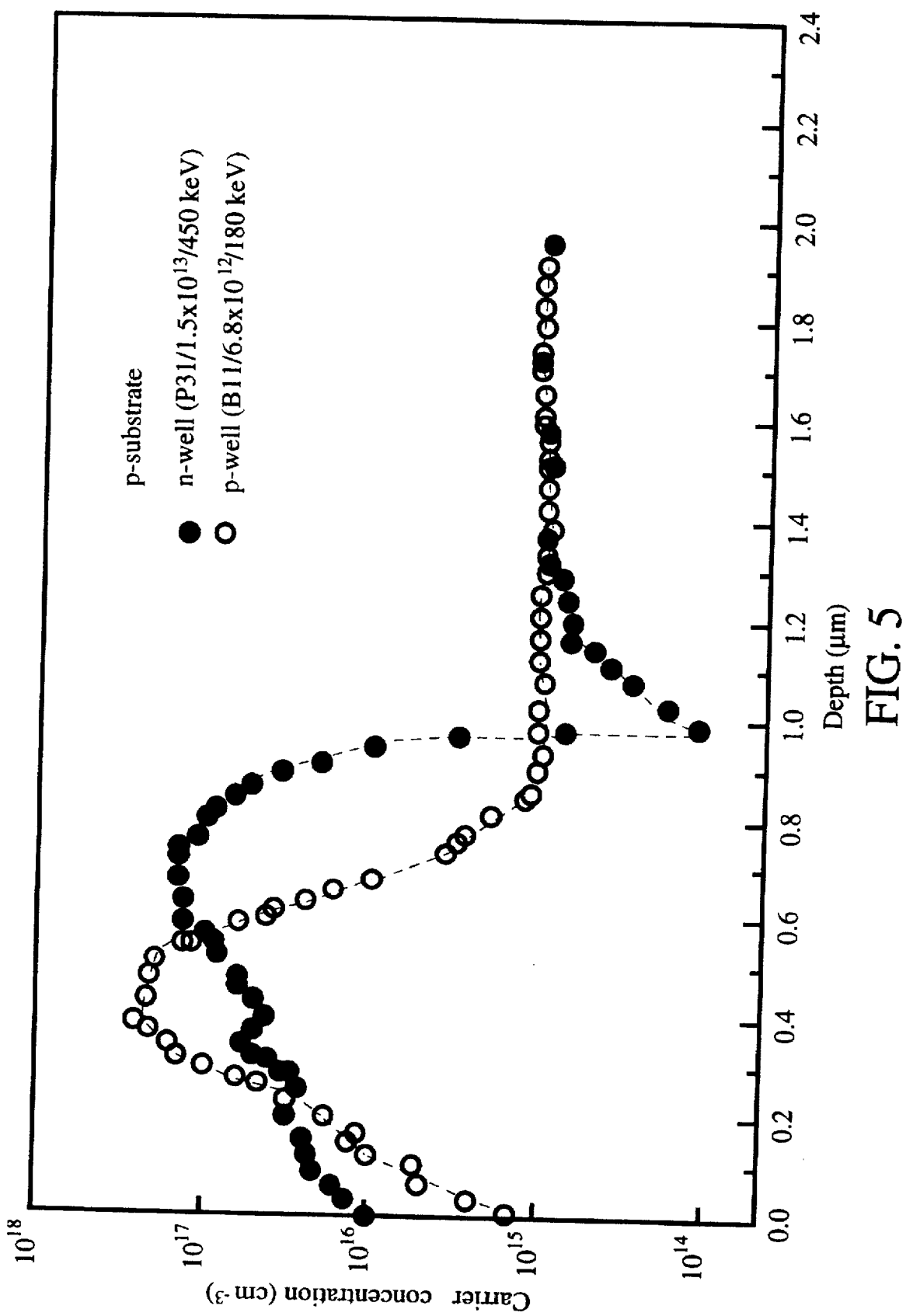
FIG. 5 graphically illustrates measured carrier concentration profile for an n-well and for a p-well that are formed using a retrograde well implant process.

Preferably, the tap regions and drain region are arranged to promote uniform heating in the p-well, n-well and substrate regions, to control the resistance to current flow in these regions. Control of this resistance can be used to lower the resistance value R89 shown in FIG. 8.

Where a retrograde well implant process is used in a p substrate, the p-well 23 and/or n-well 25 may have carrier concentration profiles that are approximately as shown in FIG. 5. The retrograde n-well has a carrier concentration that rises sharply to about 1–5×$10^{17}$ cm$^{-3}$ near a surface, then falls precipitously to about $10^{14}$ cm$^{-3}$ in a short distance (≈0.2 μm) into the semiconductor material, and then recovers to about $10^{15}$ cm$^{-3}$. The retrograde p-well has a carrier concentration that is similar to that for the n-well shown in FIG. 5. These and similar carrier concentration profiles produce retarding internal electrical fields that suppress base transport in the parasitic bipolar transistors that develop in the p-well 23 and/or in the n-well 25. The well implant concentration profile, formed as indicated in FIG. 5, may be subjected to thermal drive-in, using processes well known in the art. Use of thermal drive-in provides a well with a more uniform carrier Concentration and may lower the dynamical resistance associated with a device using such a well. However, the retrograde p-well 23 and/or n-well 25 in FIG. 4 may also be formed without use of thermal drive-in.

The p-well 23 and/or the n-well 25 can also be formed by conventional well implant methods, on an epitaxial layer of thickness 50–20,000 Å having a carrier concentration in the range $10^{14}$–$10^{16}$ cm$^{-3}$. Where a conventional well implant approach is used, the marked increase, shown in FIG. 5, of charge carrier concentration with increasing depth near the interface with the epitaxial layer will be absent or will be reduced in magnitude. Use of a non-epitaxial wafer with retrograde wells is less expensive than use of an epitaxial wafer. Alternatively, a conventional well implant process without an epitaxial layer may be used to form the p-well 23 and/or the n-well 25.

Where an epitaxial layer is used, a conventional ESD protection device that includes such layer will normally have a relatively high triggering voltage, possibly too high to provide effective ESD protection. The invention lowers the triggering voltage of the associated ESD protection device sufficiently that effective ESD protection is still available. Where conventional wells on a non-epitaxial wafer are used to form an ESD protection device, the triggering voltage is lower, vis-a-vis the triggering voltage for an ESD device formed using an epitaxial layer, and may be lowered further using the invention.

Figure 6:
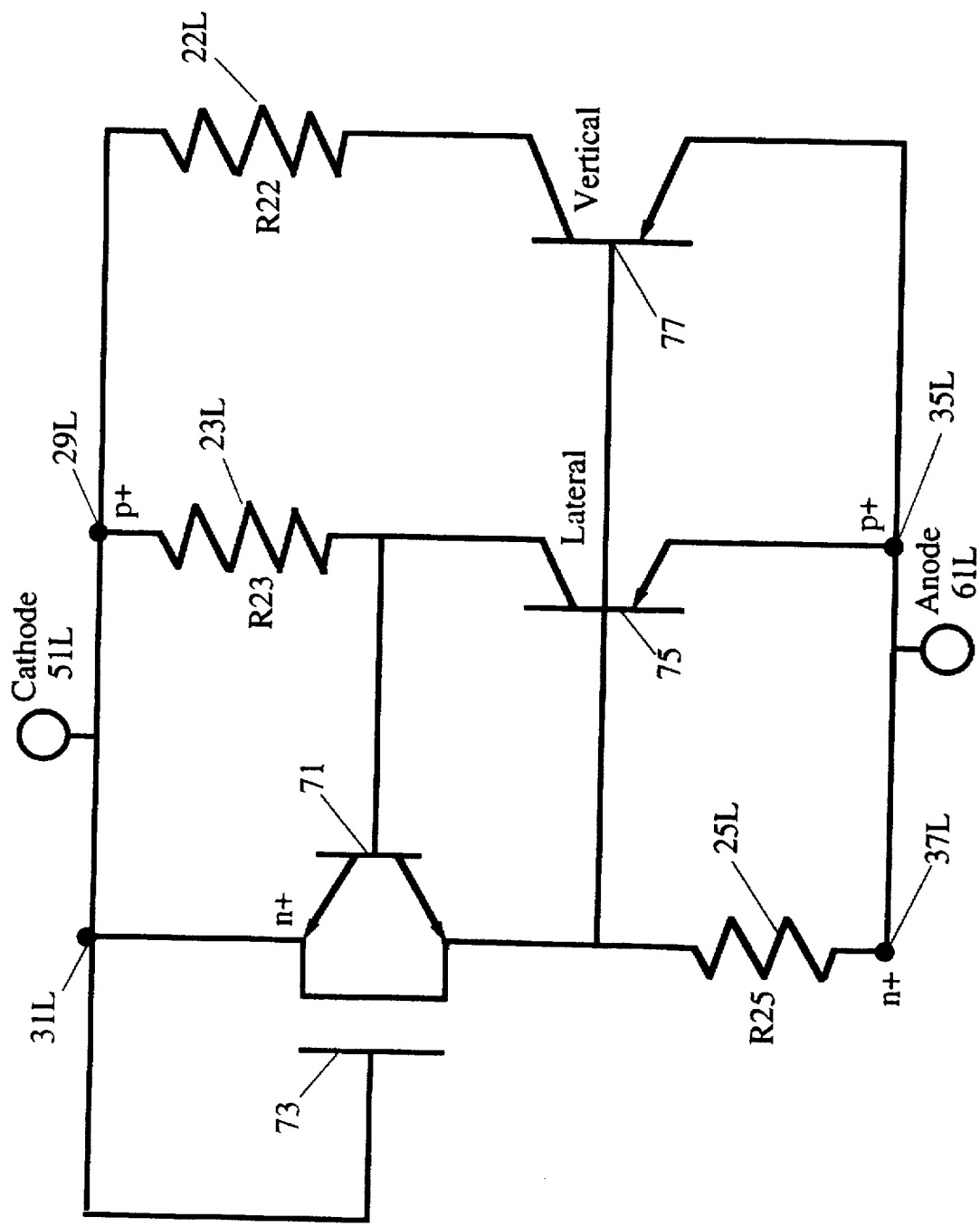
FIG. 6 schematically illustrates a lumped parameter model for an SCR.

FIG. 6 schematically illustrates a lumped parameter model of the SCR shown in FIG. 4. The resistances 22L, 23L and 25L are the resistances, in this lumped parameter model, associated with the substrate 22, the p-well 23 and the n-well 25 in FIG. 4, respectively. The node points 29L, 31L, 35L and 37L correspond to the first p+ tap region 29, the first n+ tap region 31, the second p+ tap region 35, and the second n+ tap region 37, respectively, in FIG. 4. The transistor 71 corresponds to development of lateral transistor action from the first n+ region 31 across the gate oxide region 43 and across the linking n+ region 27 to the n-well 25. The lateral transistor 75 and the vertical transistor 77 are similarly interpreted.

Figure 7:
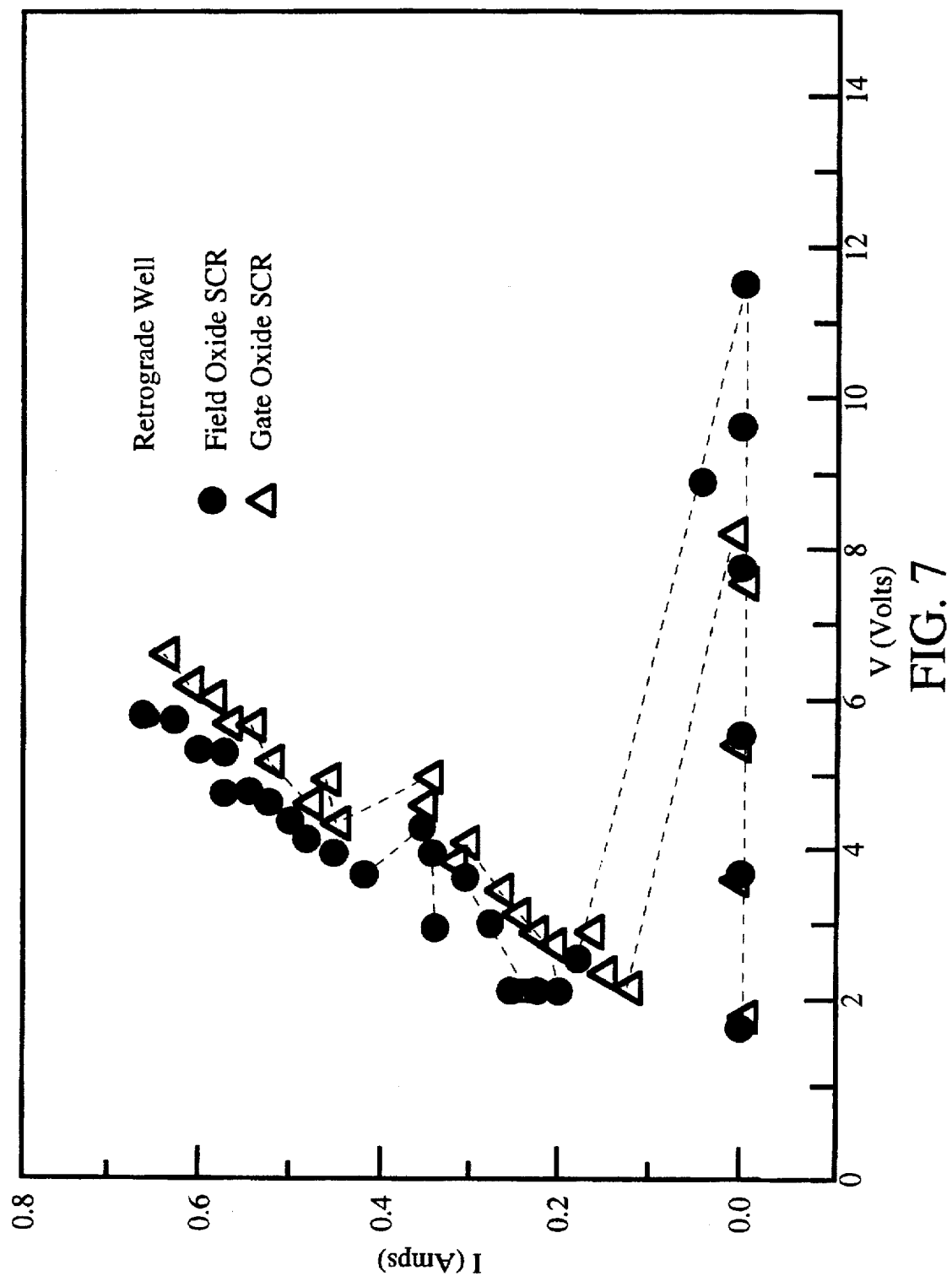
FIGS. 7 and 10 graphically illustrate electrical current developed versus applied voltage for a gate oxide SCR device and a field oxide SCR device fabricated according to the invention.

FIG. 7 illustrates the effect on measured triggering voltage using retrograde well fabrication to form an ESD protection device according to the invention. For a gate oxide of thickness 40–200 Å, and a field oxide of thickness 200–6000 Å, the triggering voltages range from about 5.6 to about 11 Volts and from about 11 to about 20 Volts, respectively. For a gate oxide thickness of 70 Å, a triggering voltage of 8.2 Volts is attainable. However, these triggering voltages are also sensitive to the value of the "poly length" L(poly) (FIG. 4) of the polysilicon region 53, which is in turn controlled by etching of the sidewalls of the poly region 53, among other things. Other things being equal, the lower the poly length L(poly) and the lower the thickness of the oxide region that underlies the poly region 53, the lower the triggering voltage. A tunable triggering voltage lying between 5.0 and 20.0 Volts appears to be attainable, using the technology of the present invention.

Figure 8:
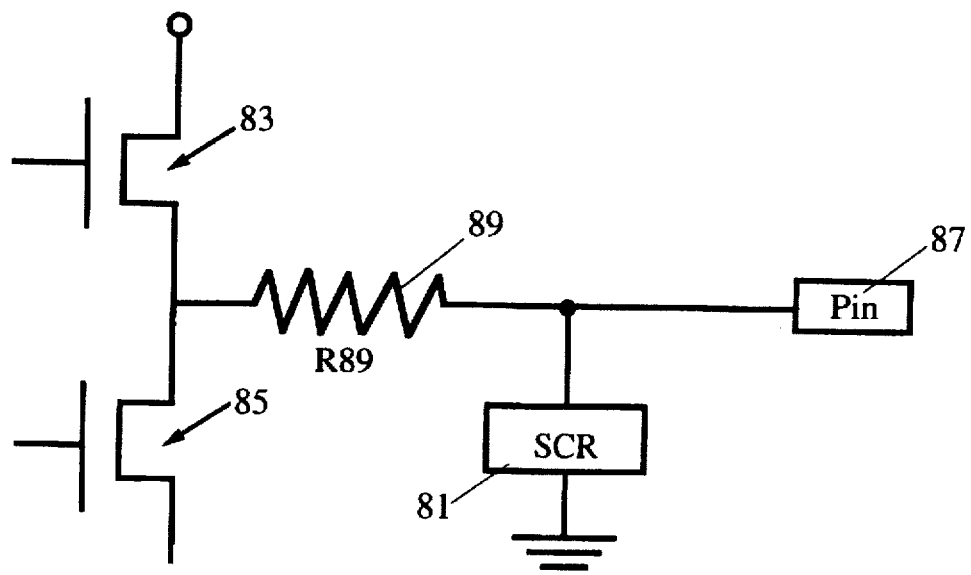
FIG. 8 is a schematic view of a circuit protected by an ESD device.

Provision of an ESD protection device with a tunable, low value triggering voltage is desirable here, but triggering voltage is not the only parameter of concern. FIG. 8 illustrates use of the invention to provide an SCR device 81 that protects drivers 83 and 85 for an input/output pin 87 against ESD. The SCR device 81 is connected to the drivers 83 and 85 by a resistor 89 having a controllable equivalent resistance R89, whose value may lie in the range 0–40 Ohms. The resistor 89 can be an n-well resistor, an n+ region resistor or a metal silicide resistor.

Figure 9:
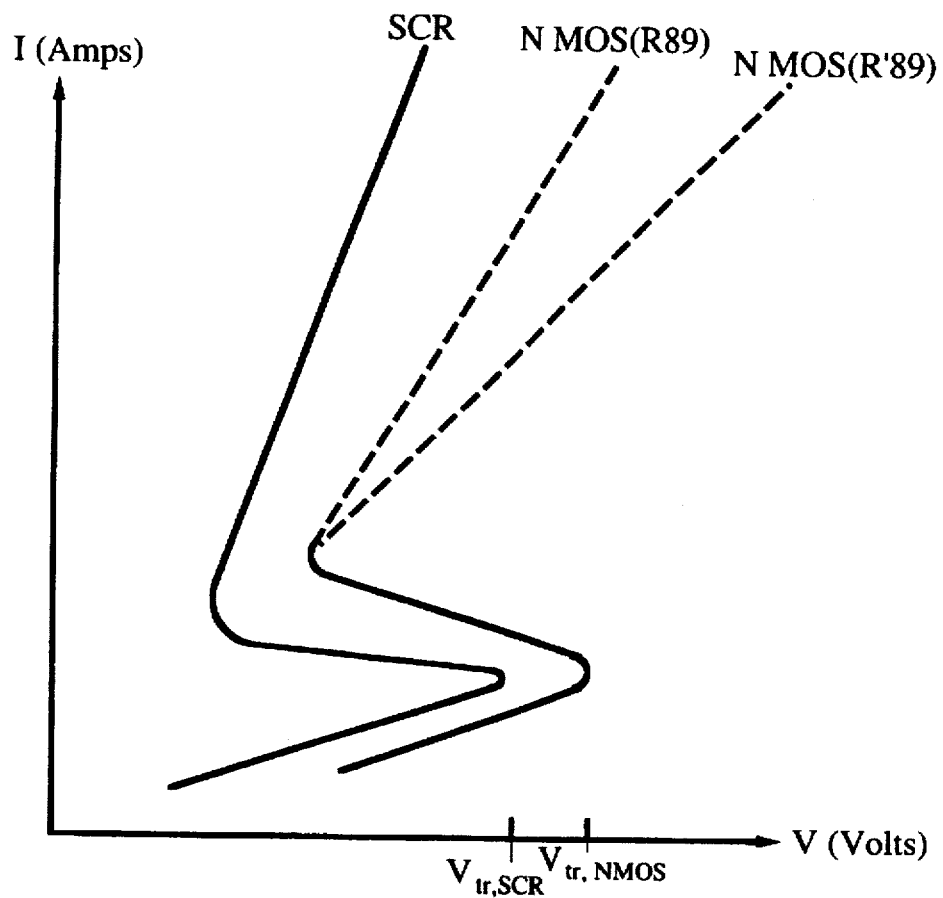
FIG. 9 graphically compares the current-versus-voltage curves with snapback for an NMOS device and for an SCR device formed according to the invention.

The driver 85 in FIG. 8 may be an NMOS device that follows a snapback voltage curve, shown in FIG. 9 for different resistance values R89 and R'89 (>R89). The SCR device may follow a different snapback voltage curve, shown for comparison in FIG. 9, with a much lower triggering voltage, higher current in the on-state, and lower dynamical resistance. Preferably, the applicable NMOS curve will lie to the right of and below the SCR curve in FIG. 9, indicating that the SCR dynamical resistance in the on-state, $R_{d,81}$ is less than the NMOS device dynamical resistance, $R_{d,85}$+R89, for all values of the voltage V. This would insure that a majority of the current flows through the SCR device 81 in FIG. 8, not through the driver 85.

Figure 10:
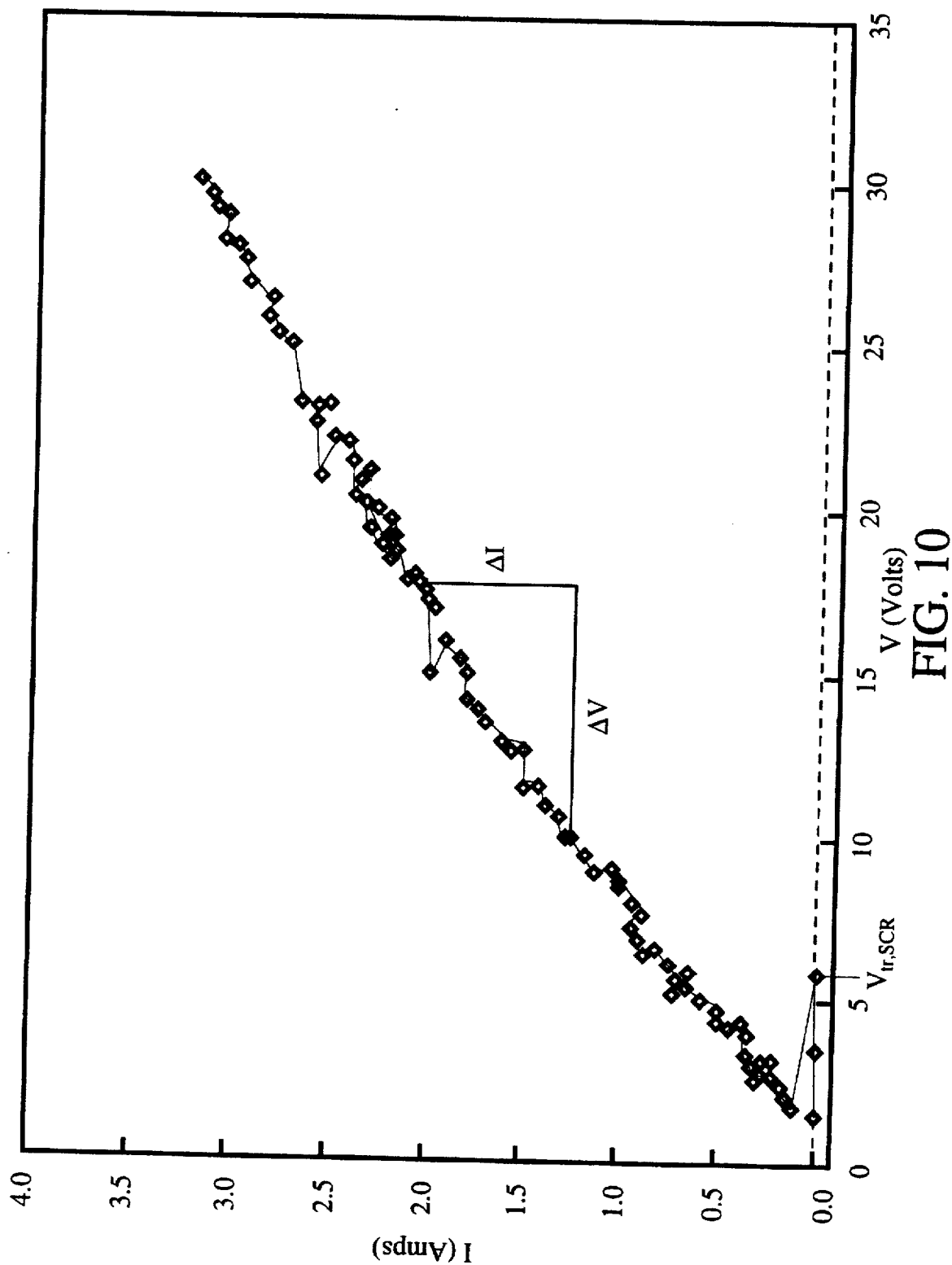

FIG. 10 shows measured SCR triggering voltage, which can be lowered to about 5.6 Volts, and probably to below 5.0 Volts, and measured on-state current-voltage behavior, using low poly length and a thin gate oxide region to form an SCR device with a gate oxide for ESD protection according to the invention. The invention allows the SCR trigger voltage $V_{tr,SCR}$ in FIG. 9 or 10 to be controllably set at a value less than the NMOS trigger voltage $V_{tr,NMOS}$ in FIG. 9 so that the SCR device 81 in FIG. 8 will respond to presence of a voltage pulse before the NMOS device responds to this voltage pulse.

After snapback has occurred and the SCR device operates in the on-state, interest focuses on the dynamical resistance $R_{d,81}=(\Delta I/\Delta V)_{81}^{-1}$ of the SCR device 81 vis-a-vis the dynamical resistance $R_{d,85}=(\Delta I/\Delta V)_{85}^{-1}+R89$ of the NMOS device (FIG. 8). Dynamical resistance is the inverse slope $(\Delta I/\Delta V)^{-1}$ of the current-voltage curve in the on-state or switched region $I>I_s$ in FIG. 10. The dynamical resistance values for the SCR device 81 and for the driver 85 may differ from each other. If $R_{d,81}<R_{d,85}+R89$, the SCR device 81 will shunt to ground proportionately more of a current pulse produced than will the driver 85 in the circuit in FIG. 8. If $R_{d,81}>R_{d,85}+R89$, the roles are reversed. Thus, it is important to arrange for $R_{d,81}$ to be less, preferably much less, than $R_{d,85}+R89$ so that the SCR device will absorb and shunt to ground most of the current associated with an unwanted current pulse in the circuit shown in FIG. 8. FIG. 10 also indicates that the dynamical resistance $(\Delta I/\Delta V)^{-1}$ of an ESD device, prepared according to the invention, can be as low as 8.3 Ohms, and possibly lower. For ESD devices prepared by conventional methods, the corresponding dynamical resistance often exceeds 13 Ohms.

Figure 11:
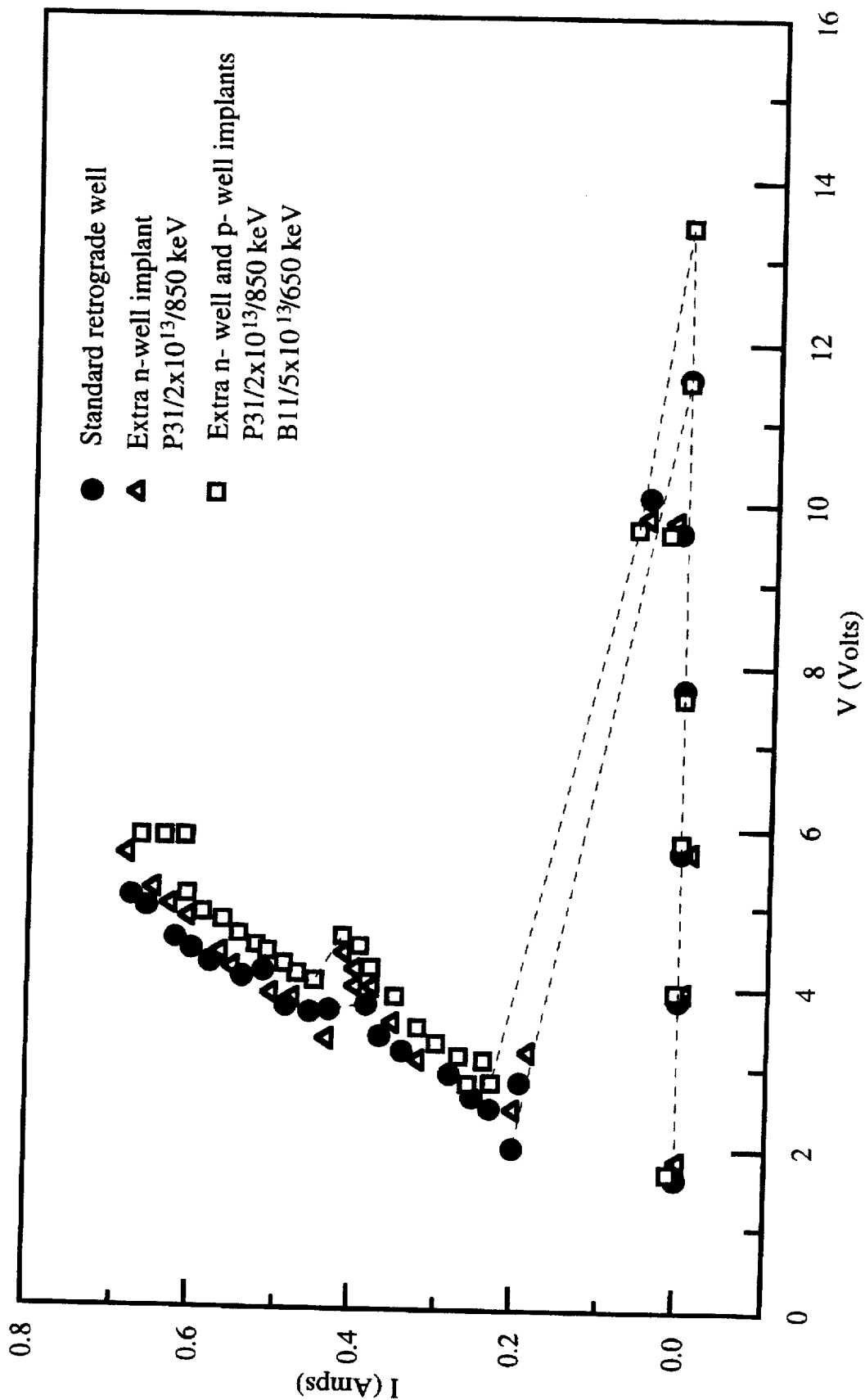
FIG. 11 graphically illustrates electrical current versus applied voltage for a field oxide SCR device, using a retrograde well with standard implant and extra implant processes.

FIG. 11 illustrates the effect of using additional ion implants ($2\times10^{13}$ cm$^{-3}$ of 850 keV P implants or $5\times10^{13}$ cm$^{-3}$ of 650 keV B implants) to form a supplemented implant retrograde well, vis-a-vis a standard retrograde well. The standard retrograde well SCR device has a smaller triggering voltage ($\approx11.5$ Volts) and a smaller switching voltage ($\approx2$ Volts) than does the supplemented implant retrograde well SCR device (13.2 Volts and 3 Volts, respectively). The supplemented implant process is sometimes included for latchup suppression but may cause additional problems for operation of an ESD protection device. Use of a supplemented well implant process to form an SCR device produces a relatively small increase (less than 2 volts) in triggering voltage vis-a-vis the triggering voltage for an SCR device formed by a conventional retrograde well process. This is a desirable feature of the invention and indicates that only modest trade-off is required here if a supplemented well implant process is used.

Figure 12:
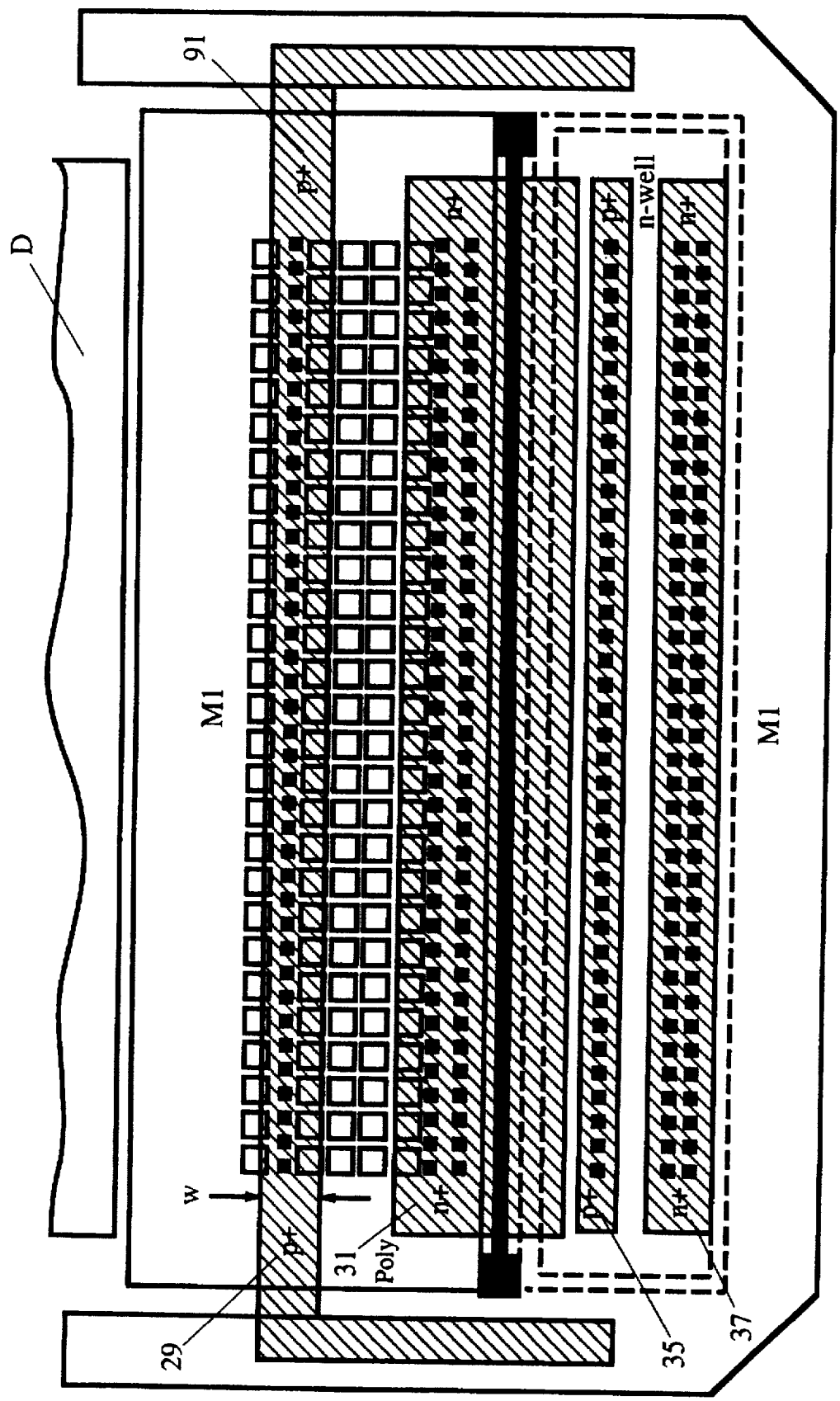
FIGS. 12 and 13 are schematic top views of the SCR shown in FIG. 4, also showing positioning of a guard band or a guard ring, respectively, partly or fully surrounding the SCR components, for ESD protection against receipt of a positive electrical pulse.

As illustrated in a top view in FIG. 12, the ESD device 21 of FIG. 4 is partly surrounded by a U-shaped guard band or region 91, formed from the first p+ tap region 29, that extends past the first n+ tap region 31, the linking region 27 (FIG. 4), and the second p+ tap region 35, to suppress or eliminate leakage or transport of minority carriers from the contact region 31 and linking region 27 to any other portion of an electron device associated with the ESD device 21 beyond the guard ring. By careful placement of the guard band 91, the leakage or transport of minority current, especially carriers from the n+ regions 27 and 31 to regions beyond the guard ring, can be reduced by one to two orders of magnitude, thus reducing the current gain factor of any parasitic bipolar transistor that uses an n+ region as a collector or emitter. Optionally, the guard region can be extended to form an O-shaped guard ring 92 surrounding the SCR device, as shown in FIG. 13.

Figure 13:
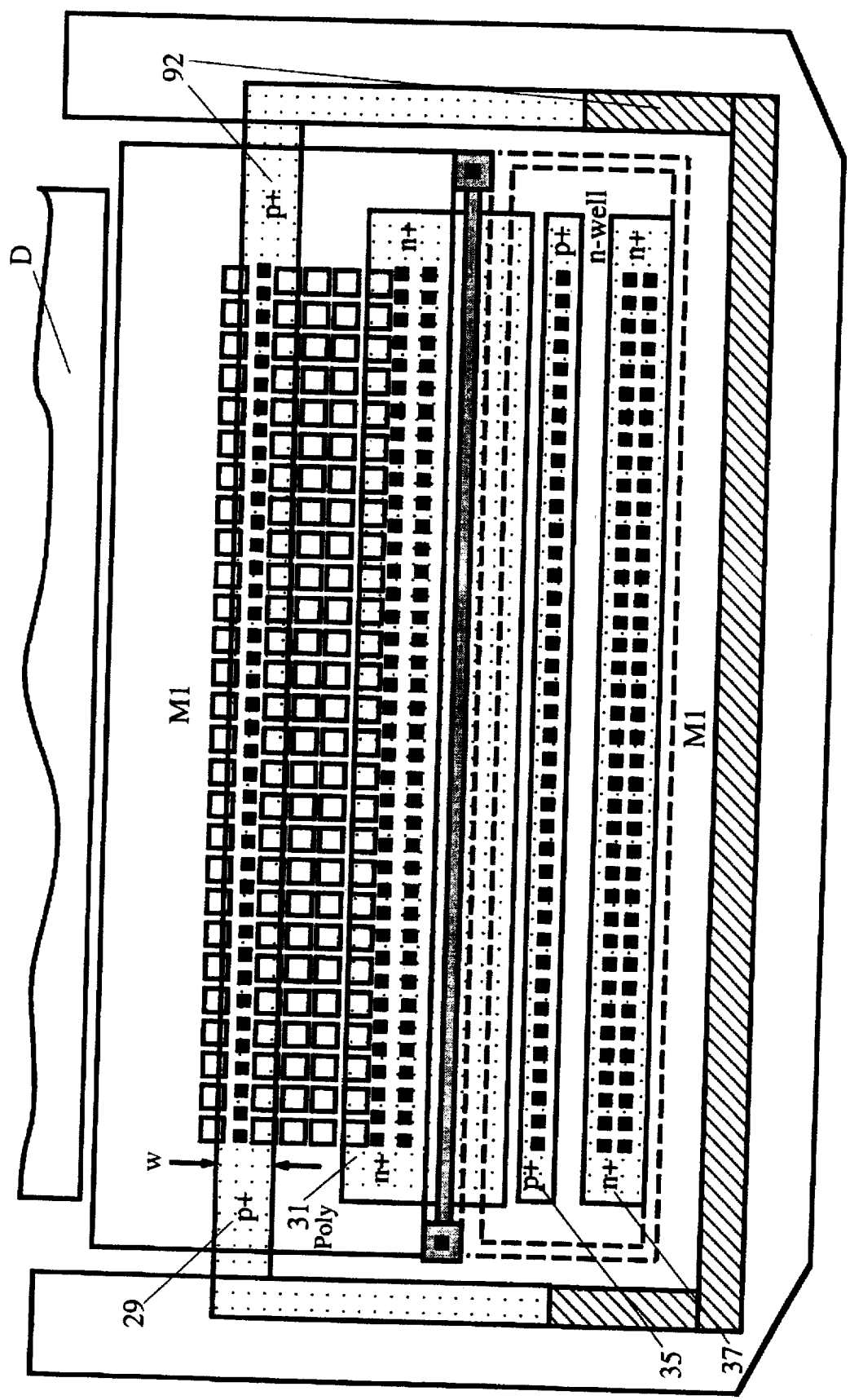

The width w of the guard band 91 or of the guard ring 92 shown in FIG. 12 or FIG. 13 can be quite small, in the range 0.6–10 μm but preferably no more than 3 μm, compared to the width of a guard band used to protect a driver device D against ESD in a conventional approach.

Figure 15:
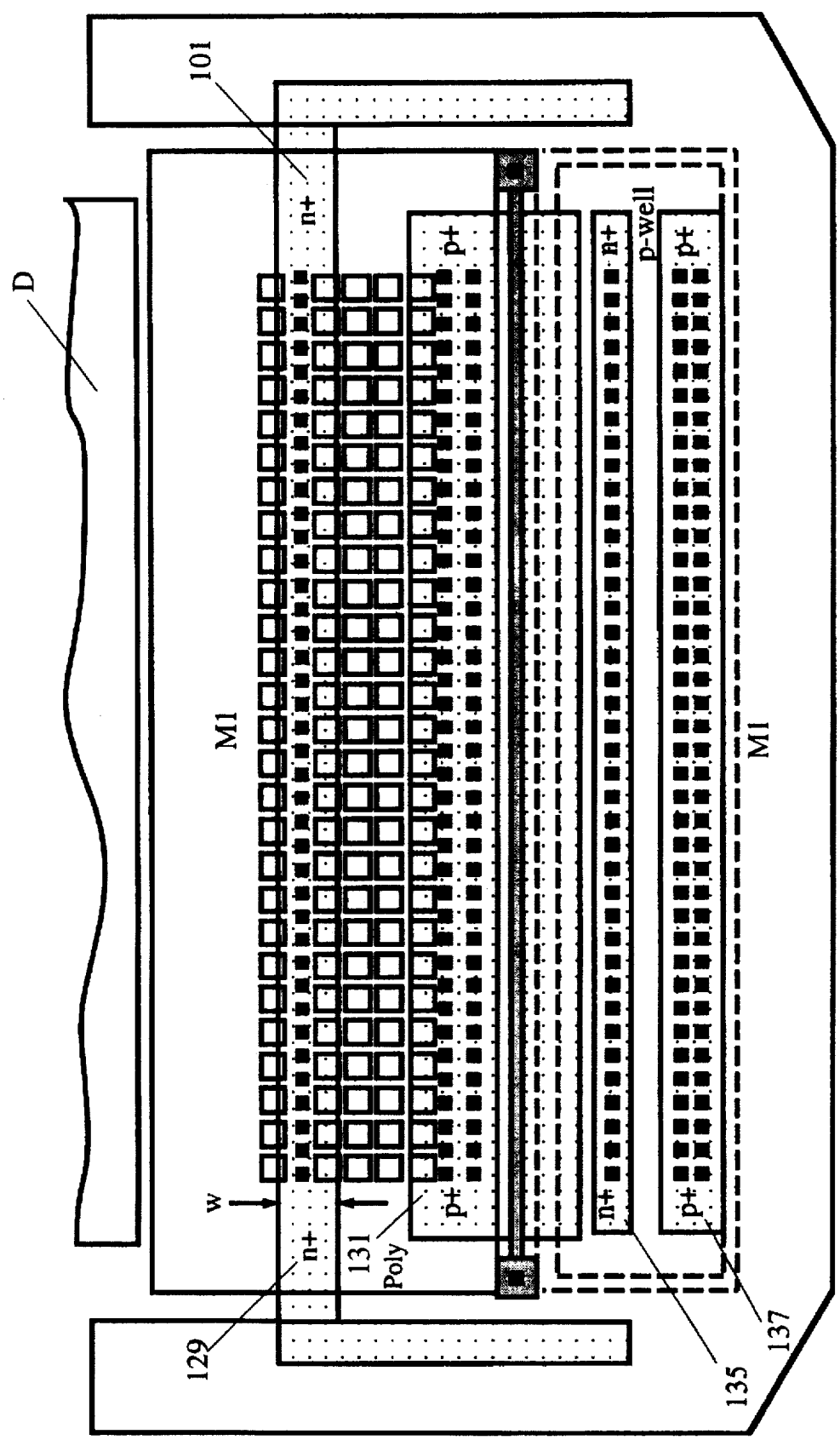
FIGS. 15 and 16 are schematic top views of the SCR shown in FIG. 12, also showing positioning of a guard band or a guard ring, respectively, partly or fully surrounding the SCR components, for ESD protection against receipt of a negative electrical pulse.
Figure 16:
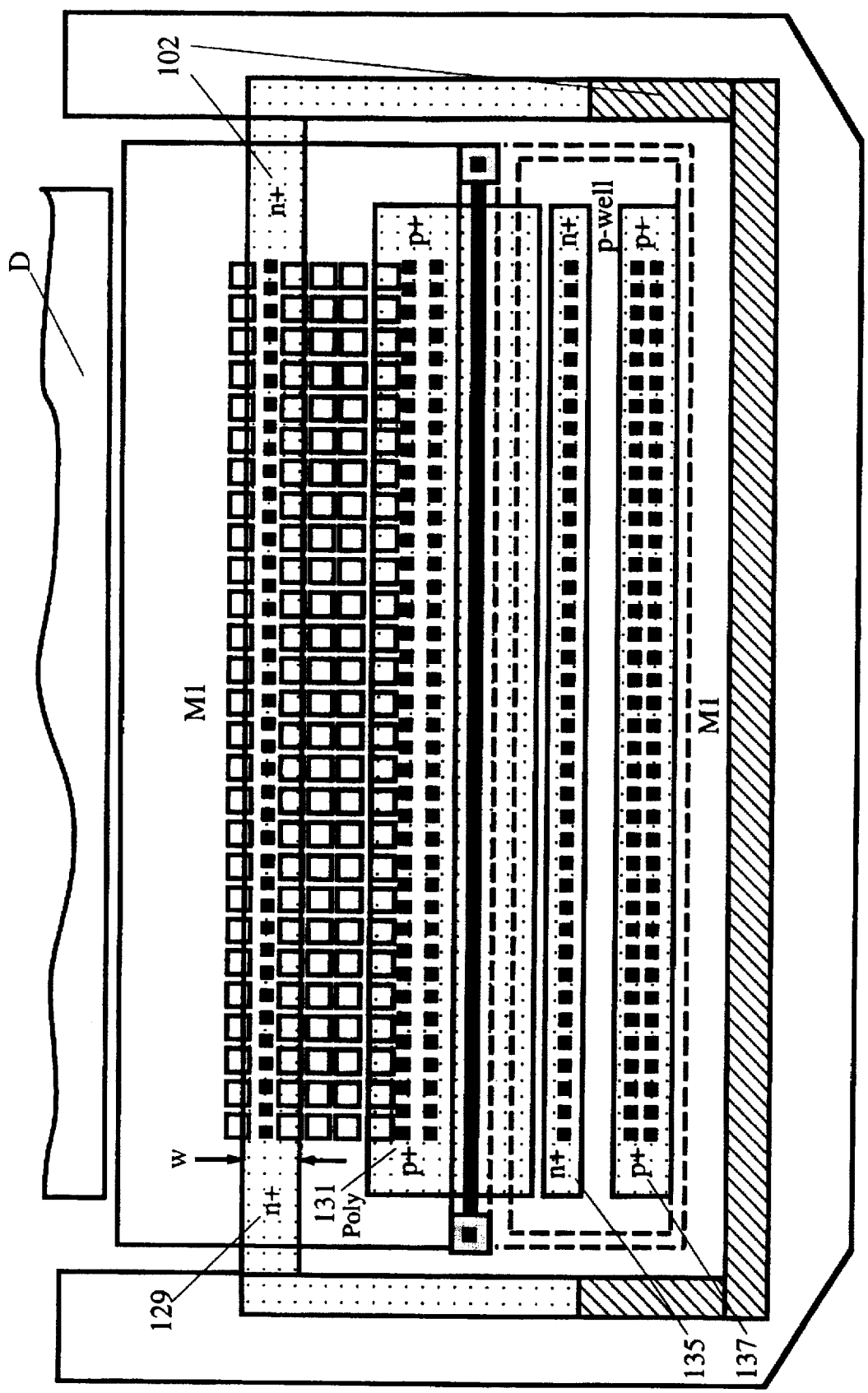

FIGS. 12 and 13 are intended to provide ESD protection for a device D that receives a positive electrical pulse. If the driver device D is to be protected against receipt of a negative electrical pulse, the apparatus shown in FIG. 4 is replaced by the apparatus 121 shown in FIG. 14, in which: (1) the p-substrate 122, (2) the p-well 123 and n-well 125, (3) the p-well contact regions 129 and 135, (4) the n-well contact regions 127, 131 and 137 (FIG. 13) have their electrical polarities reversed relative to the respective polarities shown in FIG. 4. In this instance, the guard band 91 and guard ring 92 shown in FIGS. 12 and 13, respectively, are replaced by a U-shaped guard band 101 or by a guard ring 102, as shown in FIGS. 15 and 16, respectively.

Figure 14:
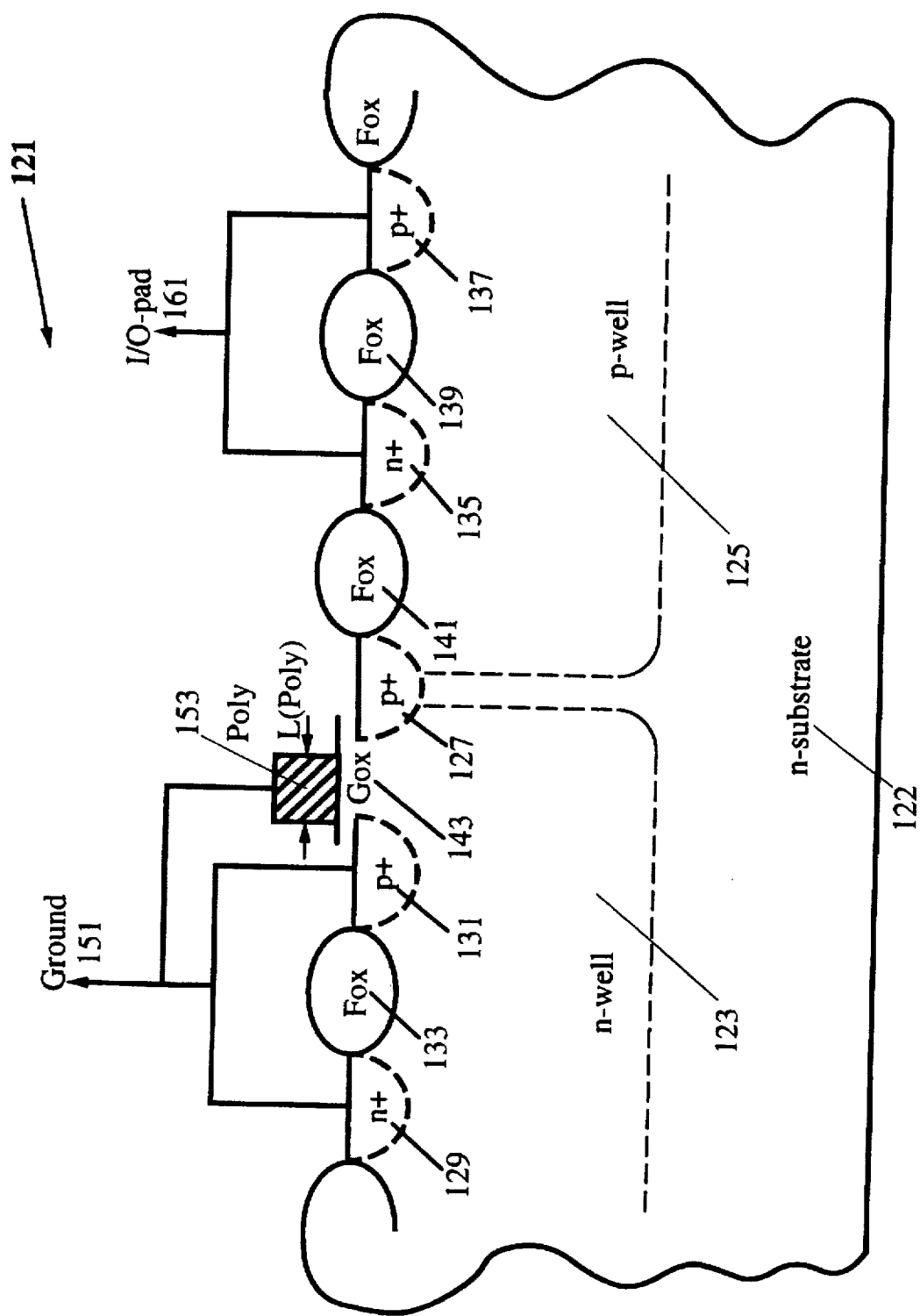
FIG. 14 schematically illustrates a representative SCR design, constructed according to the invention to handle negative electrical pulses.
Figure 17:
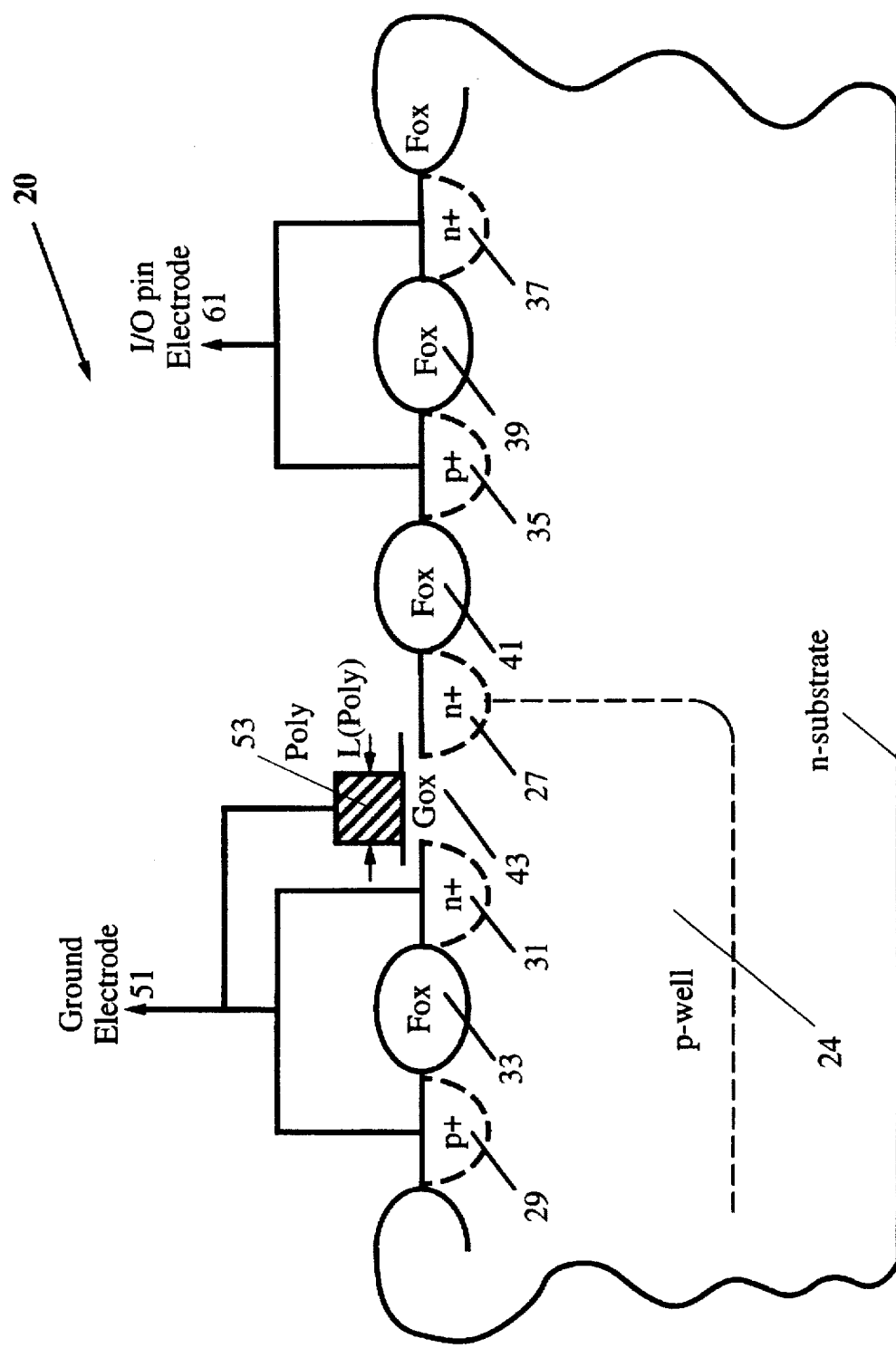
FIG. 17 is an analog of FIG. 4, showing use of a single well replacing the twin tub wells used in FIG. 4.

Although the ESD protection devices shown in FIGS. 4 and 14 indicate use of twin tub wells 23 and 25, a single tub p-well 24 and an n-substrate 22' can replace these twin tubs and the p-substrate 22, respectively, in this invention, as shown an alternative configuration 20 in FIG. 17.

In a preferred embodiment of the invention, the ESD device is fabricated as shown in FIG. 4 or FIG. 14, using twin wells formed by retrograde well implant, with or without thermal drive-in. The length of the polysilicon region 53 or 153 and/or the thickness of the gate oxide region 43 or 143 are varied to produce an SCR device for ESD protection having a controllably low triggering voltage in the range 5–11 Volts and having a dynamical resistance in the on-state of about 8–9 Ohms.

We claim:

1. Apparatus for protection of an electronic circuit against damage from electrostatic discharge (ESD), the apparatus comprising:

a substrate of semiconductor material of a first electrical polarity having an exposed surface;

a first well of semiconductor material having the first polarity, formed in a first portion of the substrate at a first portion of the exposed surface;

first and second electrical contact regions, spaced apart by a first substrate surface region that is electrically insulating, formed in the first well at the substrate exposed surface, and having the first polarity and a second polarity, respectively, where the second polarity is opposite to the first polarity;

a gate oxide region, having a selected thickness T, formed in the first well at an exposed surface of the substrate and contiguous to the second contact region but spaced apart from the first contact region;

third and fourth electrical contact regions, spaced apart by a second substrate surface region that is electrically insulating, formed at the substrate exposed surface in a second portion of the substrate that is separate from the first well, and having the first and the second polarities, respectively;

a third electrically insulating substrate surface region, formed in the second portion of the substrate and contiguous to the third contact region but spaced apart from the fourth contact region;

a fifth electrical contact region, formed at the exposed surface of the substrate, lying between and being contiguous to the gate oxide region and to the third electrically insulating substrate surface region, and having the second polarity;

first voltage means, connected to the first contact region, to the second contact region and to the gate oxide region, for imposing a selected first electrical voltage on the first contact region, the second contact region and the gate oxide region; and second voltage means, connected to the third contact region, to the fourth contact region and to selected electrical circuit to be protected against ESD, for imposing a selected second electrical voltage that differs from the first electrical voltage on the third contact region, the fourth contact region and the selected electrical circuit.

2. The apparatus of claim 1, wherein said third and fourth electrical contact regions and said second electrically insulating substrate surface region are positioned n a second well of semiconductor material in said substrate having said second electrical polarity, where the second well is spaced apart from said first well by a selected distance.

3. The apparatus of claim 2, wherein at least one of said first well and said second well is formed using a retrograde Well fabrication process.

4. The apparatus of claim 2, wherein at least one of said first well and said second well is formed using a conventional well implant process.

5. The apparatus of claim 4, wherein at least one of said first well and said second well is formed upon an epitaxial layer of semiconductor material.

6. The apparatus of claim 1, wherein said first voltage means comprises:

a polysilicon region, having a selected length L measured in a direction parallel to the exposed surface of said substrate, positioned above and contiguous to said gate oxide region; and a first electrode, connected to said first contact region, to said second contact region and to said polysilicon region;

wherein said second voltage means comprises a second electrode, connected to said third contact region, to said fourth contact region and to said selected electrical circuit to be protected against ESD; and a voltage difference supply, connected between the first electrode and the second electrode, to impose a controllable electrical voltage difference between the first and second electrodes.

7. The apparatus of claim 6, wherein said polysilicon length L lies in the range 0.1–1.0 μm.

8. The apparatus of claim 7, wherein said polysilicon length L lies in the range 0.4–0.7 μm.

9. The apparatus of claim 7, wherein said gate oxide thickness T lies in the range 40–200 Å.

10. The apparatus of claim 9, wherein said apparatus manifests a triggering voltage for snapback that is tunable over the range 5–11 Volts.

11. The apparatus of claim 10, wherein said apparatus in its "on" state has an associated dynamical resistance in the range 8–9 Ohms.

12. The apparatus of claim 1, wherein said first electrical polarity is produced by an excess of negatively charged carriers and said second electrical polarity is produced by an excess of positively charged carriers.

13. The apparatus of claim 1, wherein said first electrical polarity is produced by an excess of positively charged carriers and said second electrical polarity is produced by an excess of negatively charged carriers.

14. The apparatus of claim 1, further comprising a charge carrier guard region, formed at the exposed surface of said first well as an extension of said first contact region and extending from said first contact region laterally toward said fourth contact region so that the guard region at least partly surrounds said second contact region and said third contact region, to suppress injection of electrically charged carriers from said second contact region.

15. The apparatus of claim 14, wherein said guard region substantially completely surrounds said second contact region, said third contact region and said fourth contact region.

16. The apparatus of claim 14, wherein said guard region has a width in the range of 0.6–10 μm.

17. A method for protection of an electronic circuit against damage from electrostatic discharge (ESD), the method comprising the steps of:

providing a substrate of semiconductor material of a first electrical polarity having an exposed surface;

forming a first well of semiconductor material having the first polarity in a first portion of the substrate at a first portion of the exposed surface;

forming first and second electrical contact regions, spaced apart by a first substrate surface region that is electrically insulating, in the first well at the substrate exposed surface, and having the first polarity and a second polarity, respectively, where the second polarity is opposite to the first polarity;

forming a gate oxide region, having a selected thickness T, in the first well at an exposed surface of the substrate and contiguous to the second contact region but spaced apart from the first contact region;

forming third and fourth electrical contact regions, spaced apart by a second substrate surface region that is electrically insulating, at the substrate exposed surface in a second portion of the substrate that is separate from the first well, and having the first and the second polarities, respectively;

forming a third electrically insulating substrate surface region, in the second portion of the substrate and contiguous to the third contact region but spaced apart from the fourth contact region;

forming a fifth electrical contact region at the exposed surface of the substrate, lying between and being contiguous to the gate oxide region and to the third electrically insulating substrate surface region, and having the second polarity;

providing first voltage means, connected to the first contact region, to the second contact region and to the gate oxide region, for imposing a selected first electrical voltage on the first contact region, the second contact region and the gate oxide region; and providing second voltage means, connected to the third contact region, to the fourth contact region and to a selected electrical circuit to be protected against ESD, for imposing a selected second electrical voltage that differs from the first electrical voltage on the third contact region, the fourth contact region and the selected electrical circuit.

18. The method of claim 17, further comprising the step of forming said third and fourth electrical contact regions and said second electrically insulating substrate surface region in a second well of semiconductor material in said substrate having said second electrical polarity, where the second well is spaced apart from said first well by a selected distance.

19. The method of claim 18, further comprising the step of forming at least one of said first well and said second well using a retrograde well fabrication process.

20. The method of claim 18, further comprising the step of forming at least one of said first well and said second well using a conventional well implant process.

21. The method of claim 20, further comprising the step of forming at least one of said first well and said second well upon an epitaxial layer of semiconductor material.

22. The method of claim 17, wherein said step of providing said first voltage means comprises the steps of:

forming a polysilicon region, having a selected length L measured in a direction parallel to the exposed surface of said substrate, positioned above and contiguous to said gate oxide region; and providing a first electrode, connected to said first contact region, to said second contact region and to said polysilicon region;

wherein said step of providing said second voltage means comprises the steps of:

providing a second electrode, connected to said third contact region, to said fourth contact region and to said selected electrical circuit to be protected against ESD; and providing a voltage difference supply, connected between the first electrode and the second electrode, to impose a controllable electrical voltage difference between the first and second electrodes.

23. The method of claim 22, further comprising the step of choosing said polysilicon length L in the range 0.1–1.0 µm.

24. The method of claim 23, further comprising the step of choosing said polysilicon length L in the range 0.4–0.7 µm.

25. The method of claim 23, further comprising the step of choosing said gate oxide thickness T in the range 40–200 Å.

26. The method of claim 23, further comprising the step of choosing said polysilicon length L and said gate oxide thickness T to provide a triggering voltage for snapback that is tunable over the range 5–11 Volts.

27. The method of claim 23, further comprising the step of choosing said polysilicon length L and said gate oxide thickness T to provide an associated dynamical resistance in the range 8–9 Ohms.

28. The method of claim 17, further comprising the steps of producing said first electrical polarity by an excess of negatively charged carriers and producing said second electrical polarity by an excess of positively charged carriers.

29. The method of claim 17, further comprising the steps of producing said first electrical polarity by an excess of positively charged carriers and producing said second electrical polarity by an excess of negatively charged carriers.

30. The method of claim 17, further comprising the step of forming a charge carrier guard region, formed at the exposed surface of said first well as an extension of said first contact region and extending from said first contact region laterally toward said fourth contact region so that the guard region at least partly surrounds said second contact region and said third contact region, to suppress injection of electrically charged carriers from said second contact region.

31. The method of claim 30, further comprising the step of forming said charge carrier guard region so that said guard region substantially completely surrounds said second contact region, said third contact region and said fourth contact region.

32. The method of claim 30, further comprising the step of forming said guard region with a guard region width in the range of 0.6–10 µm.

33. A system for protection of an electronic circuit against damage from electrostatic discharge (ESD), the apparatus comprising:

a substrate of semiconductor material of a first electrical polarity having an exposed surface;

a first well of semiconductor material having the first polarity, formed in a first portion of the substrate at a first portion of the exposed surface;

first and second electrical contact regions, spaced apart by a first substrate surface region that is electrically insulating, formed in the first well at the substrate exposed surface, and having the first polarity and a second polarity, respectively, where the second polarity is opposite to the first polarity;

a gate oxide region, having a selected thickness T, formed in the first well at an exposed surface of the substrate and contiguous to the second contact region but spaced apart from the first contact region;

third and fourth electrical contact regions, spaced apart by a second substrate surface region that is electrically insulating, formed at the substrate exposed surface in a second portion of the substrate that is separate from the first well, and having the first and the second polarities, respectively;

a third electrically insulating substrate surface region, formed in the second portion of the substrate and contiguous to the third contact region but spaced apart from the fourth contact region;

a fifth electrical contact region, formed at the exposed surface of the substrate, lying between and being contiguous to the gate oxide region and to the third electrically insulating substrate surface region, and having the second polarity; and a voltage difference supply, having a first electrode connected to the first contact region, to the second contact region and to the gate oxide region and having a second electrode connected to the third contact region, to the fourth contact region and to a selected electrical circuit to be protected against ESD, to impose a controllable electrical voltage difference between the first and second electrodes.

34. The system of claim 33, wherein said third and fourth electrical contact regions and said second electrically insulating substrate surface region are positioned in a second well of semiconductor material in said substrate having said second electrical polarity, where the second well is spaced apart from said first well by a selected distance.

35. The system of claim 33, wherein said voltage difference supply comprises:

a polysilicon region, having a selected length L measured in a direction parallel to the exposed surface of said substrate, positioned above and contiguous to said gate oxide region; and a first electrode, connected to said first contact region, to said second contact region and to said polysilicon region;

wherein s aid second voltage means comprises a second electrode, connected to said third contact region, to said fourth contact region and to said selected electrical circuit to be protected against ESD; and a voltage difference supply, connected between the first electrode and the second electrode, to impose a controllable electrical voltage difference between the firs and second electrodes.

36. The system of claim 35, wherein said polysilicon length L lies in the range 0.1–1.0 µm.

37. The system of claim 36, wherein said polysilicon length L lies in the range 0.4–0.7 µm.

38. The system of claim 36, wherein said gate oxide thickness T lies in the range 40–200 Å.

39. The system of claim 38, wherein said apparatus manifests a triggering voltage for snapback that is tunable over the range 5–11 Volts.

40. The system of claim 39, wherein said system in its "on" state has an associated dynamical resistance in the range 8–9 Ohms.

* * * * *